(12) United States Patent
Morein et al.

(10) Patent No.: US 8,386,687 B2
(45) Date of Patent: Feb. 26, 2013

(54) METHOD AND APPARATUS FOR DATA TRANSFER

(75) Inventors: Stephen L. Morein, Cambridge, MA (US); Robert W. Bloemer, Sterling, MA (US)

(73) Assignee: ATI Technologies ULC, Markham, Ontario (CA)

( * ) Notice: Subject to any disclaimer, the term of this patent is extended or adjusted under 35 U.S.C. 154(b) by 0 days.

(21) Appl. No.: 13/398,987

(22) Filed: Feb. 17, 2012

(65) Prior Publication Data

US 2012/0159093 A1    Jun. 21, 2012

Related U.S. Application Data

(63) Continuation of application No. 11/161,369, filed on Aug. 1, 2005, now Pat. No. 8,156,276.

(51) Int. Cl.
*G06F 13/14* (2006.01)

(52) U.S. Cl. .................................. 710/305; 711/140

(58) Field of Classification Search .................. 710/305, 710/52–53, 39; 711/140, 154; 355/189.01
See application file for complete search history.

(56) References Cited

U.S. PATENT DOCUMENTS

| | | | |
|---|---|---|---|
| 5,588,122 A | 12/1996 | Garcia | |
| 5,778,413 A | 7/1998 | Stevens et al. | |
| 6,243,769 B1 | 6/2001 | Rooney | |
| 6,411,561 B2 | 6/2002 | Ayukawa et al. | |
| 6,862,283 B2 | 3/2005 | Marietta et al. | |
| 6,877,077 B2 | 4/2005 | McGee et al. | |

FOREIGN PATENT DOCUMENTS

| | | |
|---|---|---|
| EP | 0908827 A2 | 4/1999 |
| WO | 98/19248 | 5/1998 |

OTHER PUBLICATIONS

"Accelerated Graphics Port Interface Specification Revision 2.0"; May 4, 1998; pp. 1-259.
Nakamura, Kazuyuki et al.; "A 500-MHz 4-Mb CMOS Pipeline-Burst Cache SRAM with Point-to-Point Noise Reduction Coding I/O"; IEEE Journal of Solid-State Circuits; IEEE Service Center; vol. 32, No. 11; Nov. 1997.
EP Patent Office International Search Report; International Application No. PCT/US2006/028589; Dec. 19, 2006.

*Primary Examiner* — Clifford Knoll
(74) *Attorney, Agent, or Firm* — Faegre Baker Daniels LLP

(57) ABSTRACT

A method and apparatus for data transfer includes receiving a first data packet across a first bi-directional bus and receiving a second data packet across a second bi-directional bus. Next, the first data packet is written to a first register operably coupled to the first bi-directional bus and the second bi-directional bus. The second data packet is written to a second register operably coupled to the first bi-directional bus and the second bi-directional bus. The second data packet is then transferred across the first bi-directional bus and the first data packet is transferred across the second bi-directional bus, thereby providing data transfer across a plurality of bi-directional buses and providing for data to be transferred across those buses to be stored at an intermediate register so that the data may be transferred in the next clock cycle, overcoming any latency requirements.

4 Claims, 8 Drawing Sheets

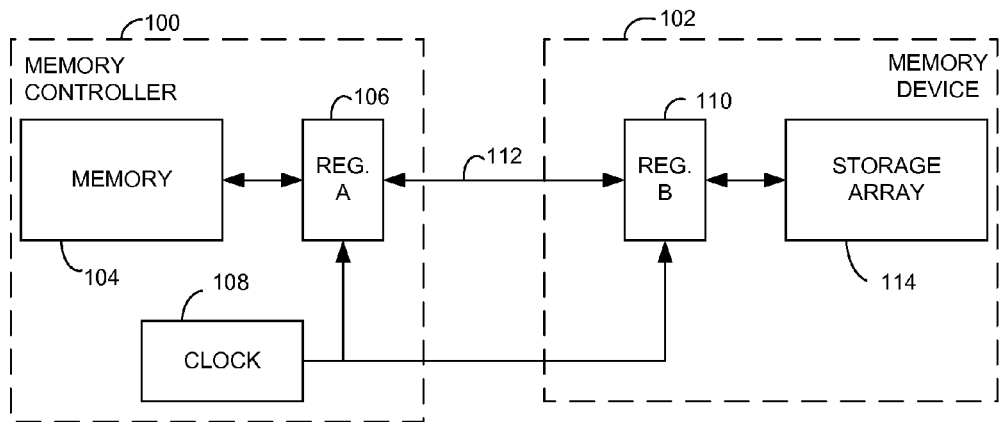
FIG. 1
(PRIOR ART)
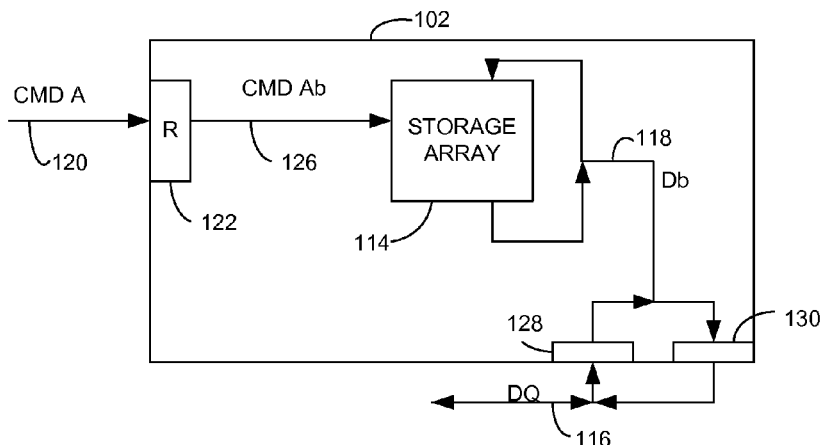
FIG. 2
(PRIOR ART)
| Clk | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| A | W | W | W | -- | Rd | Rd | Rd | -- | -- | -- | -- | -- | W | W | W | -- |
| Ab |   | W | W | W | -- | Rd | Rd | Rd | -- | -- | -- | -- | -- | W | W | W |
| SA |   |   | W | W | W | -- | Rd | Rd | Rd | -- | -- | -- | -- | -- | W | W |
| Db |   | W1 | W2 | W3 | -- | -- | -- | Rd1 | Rd2 | Rd3 | -- | -- | -- | W4 | W5 | W6 |
| DQ | W1 | W2 | W3 | -- | -- | -- | -- | -- | Rd1 | Rd2 | Rd3 | -- | W4 | W5 | W6 | -- |
FIG. 3
(PRIOR ART)

| Clk | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| A | W | W | W | Rd | Rd | Rd | -- | W | W | W | W | -- | W | W | -- |
| Ab |  | W | W | W | Rd | Rd | Rd | -- | W | W | W | W | -- | W | W |
| SA |  |  | W | W | W | Rd | Rd | Rd | -- | W | W | W | W | -- | W |
| R4 |  |  | -- | -- | -- | -- | Rd1 | Rd2 | Rd3 | -- | -- | -- | -- | -- | -- |
| R2a R2b |  |  | W1 | W2 | W3 | W4 | W4 W5 | W4 W5 | W4 W5 | W4 W5 | W5 | W6 | W7 | -- | W8 |
| Db |  | W1 | W2 | W3 | W4 | W5 | Rd1 | Rd2 | Rd3 | W6 | W7 | -- | -- | W8 | W9 |
| R3 |  |  | -- | -- | -- | -- | -- | Rd1 | Rd2 | Rd3 | -- | -- | -- | -- | -- |
| R1a R1b |  | W1 | W2 | W3 | W4 | W5 | W6 | W6 W7 | W6 W7 | W6 W7 | W6 W7 | W7 | -- | W8 | W9 |
| DQ | W1 | W2 | W3 | W4 | W5 | W6 | W7 | -- | Rd1 | Rd2 | Rd3 | -- | W8 | W9 | W10 |

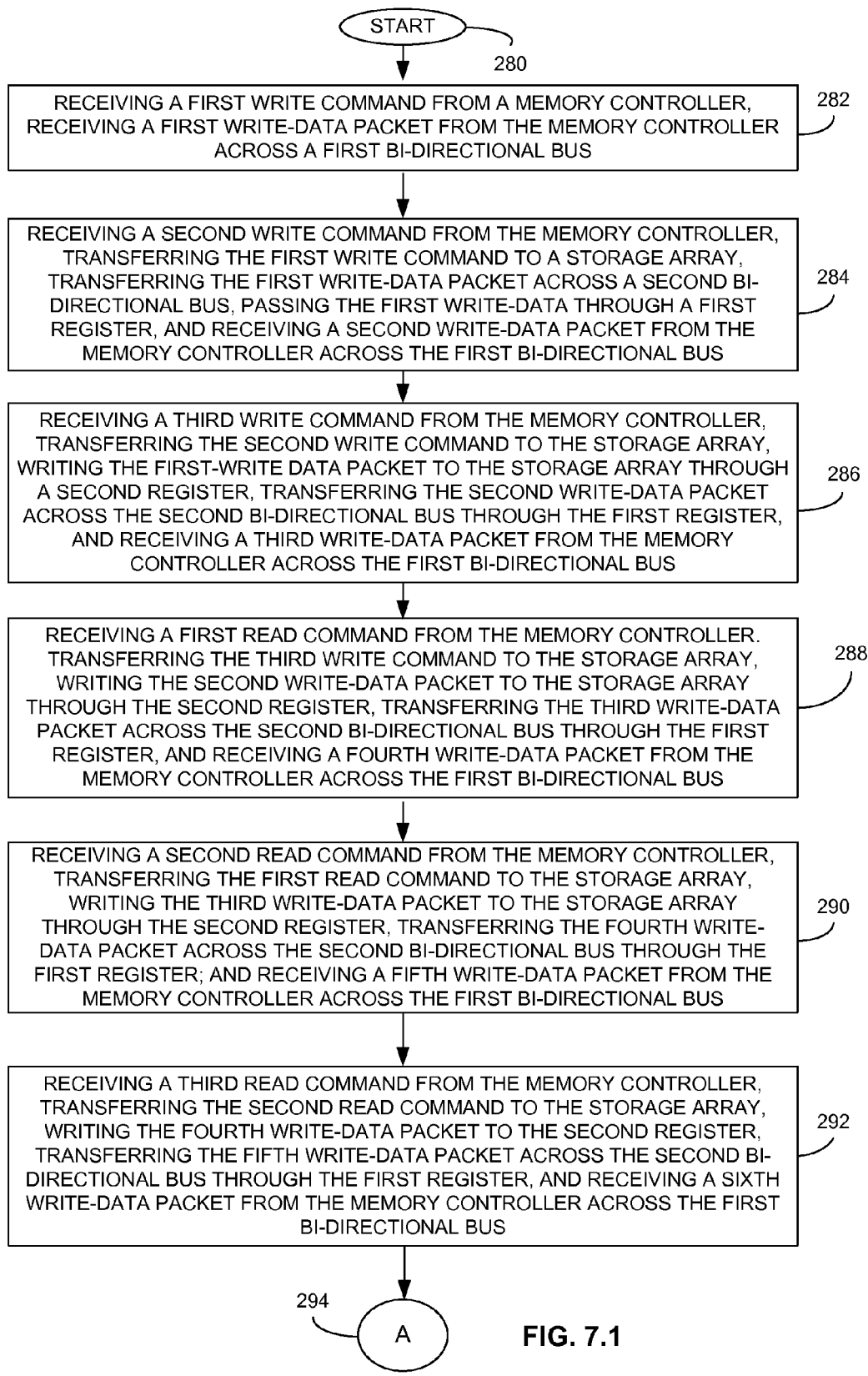
FIG. 7.1

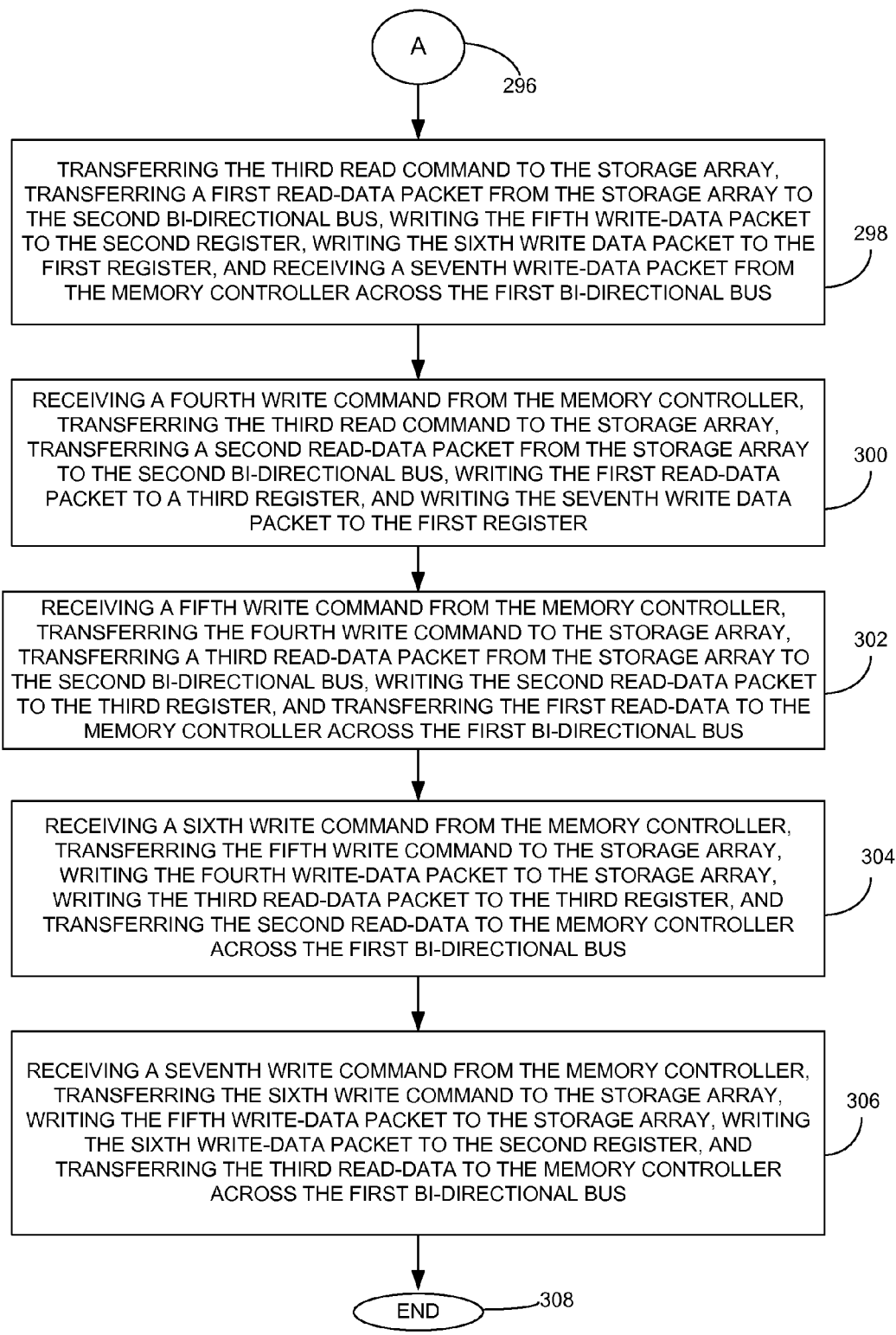
FIG. 7.2

METHOD AND APPARATUS FOR DATA TRANSFER

RELATED CO-PENDING APPLICATIONS

This application is a continuation of U.S. application Ser. No. 11/161,369, filed on Aug. 1, 2005, entitled "METHOD AND APPARATUS FOR DATA TRANSFER", having inventors Stephen L. Morein et al., which is assigned to instant assignee and is hereby incorporated by reference.

FIELD OF THE INVENTION

The present invention relates generally to bi-directional bus data transfer and more particularly to the improved transfer rate of data across a bi-directional bus.

BACKGROUND OF THE INVENTION

When information is transferred across a bi-directional bus, there is a required delay in the transfer of information. This latency requirement can decrease the efficiency of a computing system. Specifically, there is a required delay of one full clock cycle between when data is transferred in a first direction across the bi-directional bus and then transferred in a second direction across the bi-directional bus.

In a conventional memory access system, as illustrated in FIG. 1, information is transferred between a memory controller 100 and a memory device 102, such as a dynamic random access memory ("DRAM"). The memory controller 100 contains a memory 104 and a first register, register A, 106. Moreover, the memory controller 100 contains a clock 108, which provides a timing signal to a second register, register B, 110 disposed within the memory 102 and the first register 106, along connection 112.

Further within the memory device 102, the second register 110 is operably coupled to a storage array 114. The first register 106 and the second register 110 are coupled to each other across a bi-directional bus 112 for the transfer of information to and from the memory controller 100 and the memory device 102. The bi-directional bus 116 of FIG. 1 requires a latency period of at least one full clock cycle between transferring information from the first register 106 to the second register 110 and then from the second register 110 to the first register 106, and vice versa.

FIG. 2 provides further illustration of the memory 102 of FIG. 1. The memory device 102 receives a command input via bus 120 from a memory controller (not shown) similar to the memory controller 100 of FIG. 1, wherein the command is referred to as command A (CMD A). CMD A is provided to register R 122, also referred to as a first register for the discussion relating to FIG. 2. The first register 122 is coupled to the storage array 114 via bus 126, wherein a command previously stored in the first register 122 is provided to the storage array 114, referred to as command Ab (CMD Ab).

The memory device 102 further contains a second register 128 and a third register 130. The second register 128 and third register 130 represent the second register 110 of FIG. 1 coupled to the storage array 114 via a bi-directional bus Db 118. Also, the second register 128 and the third register 130 are coupled to the memory controller (not shown) across the bi-directional bus 116, referred to as bi-directional bus DQ.

FIG. 3 illustrates a table 140 representing the timing of the delay associated with a typical bi-directional bus. As recognized by one skilled in the art, table FIG. 3 can further be represented as a timing diagram showing timing pulses as generated by the clock (not shown in FIG. 2). In the table, for each clock cycle, as represented across the first row, each column entry represents the location of a write command (W), a read command (Rd), a packet of write information (W#), and a packet of read information (R#), if present.

FIG. 3 illustrates the timing of multiple read and write operations of the memory device of FIG. 2. At a first clock cycle, a first write command (W) is provided to the first register 122 as CMD A across the bus 120. Within the same clock cycle, a first write information (W1), such as a packet of data, is provided to the second register 128 across the bi-directional bus DQ 116.

At a second clock cycle, a second write command (W) is provided to the first register 122 via bus 120 as CMD A, and the first write command is provided from the first register 122 to the storage array 114 along bus 126 as CMD Ab. As the first write command, CMD Ab, is provided to the storage array 114, the first write information (W1) is transferred from the second register 128, across the bi-directional bus Db 118 to the storage array 114. Furthermore, in the second clock cycle, a second write information (W2) is provided from the memory controller (not shown) to the second register 128, across the bi-directional bus DQ 116.

In a third clock cycle, the storage array 114 writes the first write information (W1), a third write command (W) is provided to the first register 120 along bus 120 as CMD Ab, and a third write information (W3) is provided to the second register 128 along the bi-directional bus DQ 116. Within the memory 102 in the third clock cycle, the second write command is provided from the first register 122 to the storage array 114 along bus 126 as CMD Ab and the second write information (W2) is provided to the storage array 114 across the bi-directional bus Db 118.

In a fourth clock cycle, the storage array 114 writes the second write information. The third write command is provided from the first register 122 to the storage array 114 along bus 126 as CMD Ab and the third write information (W3) is transferred to the storage array 114 across the bi-directional bus Db 118. Also, in the fourth clock cycle, no CMD A is provided along bus 120 and no write information is provided along the bi-directional bus DQ 116.

In the fifth clock cycle, a first read command (Rd) is provided to the first register 122 across bus 120 as CMD A and the storage array writes the third write information (W3) therein. As no command was provided to the first register 122 in the fourth clock cycle and no write information was provided along the first bi-directional bus DQ 116, in the fifth clock cycle there is no CMD Ab transferred to the storage array across bus 126 and no information is transferred along the bi-directional bus Db 118. Moreover, as the command A in the fifth clock cycle is a read command, wherein the read information is provided by the storage array 114, no information (read or write information) is provided along either bi-directional bus, DQ 116 or Db 118.

In a sixth clock cycle, a second read command (Rd) is provided across bus 120 to the first register 122 as CMD A and the first read command is provided to the storage array across bus 128 as CMD Ab. The storage array does not execute a read operation or a write operation during this clock cycle and the bi-directional buses 116 and 118 are inactive.

In a seventh clock cycle a third read command (Rd) is provided to the first register 122 via bus 120 as CMD A. The second read command is provided to the storage array along bus 126 as CMD Ab and the first read command is executed by the storage array 114. Once again during this clock cycle, the bi-directional buses 116 and 118 are inactive.

In an eighth clock cycle, a new CMD A is not provided from the memory controller, but the third read command is provided to the storage array along bus 126 as CMD Ab. The storage array 114 executes the second read command and the first read information (Rd1) is provided to the third register 130 along the bi-directional bus, Db 118. Moreover, during this clock cycle, the bi-directional bus DQ is inactive.

In the ninth clock cycle, a new CMD A is not provided along bus 120 and due to the lack of a CMD A in the previous clock cycle, there is no CMD Ab to be provided to the storage array 114 across bus 126. The storage array 114 executes the third read command, the second read information (Rd2) is provided to the third register 130 along the bi-directional bus Db 118 and the first read information (Rd1) is provided to the memory controller (not shown) along the bi-directional bus DQ 116.

In the tenth clock cycle, a new CMD A is not provided along bus 120 and due to the lack of a CMD A in the previous clock cycle, there is no CMD Ab to be provided to the storage array 114 across bus 126, and the storage array 114 is inactive. The third read information (Rd3) is provided to the third register 130 along the bi-directional bus Db 118 and the second read information (Rd2) is provided to the memory controller along the bi-directional bus DQ 116.

In the eleventh clock cycle, the third read information (Rd3) is provided across the first bi-directional bus, DQ 116. In the twelfth clock cycle, the memory is inactive, providing the requisite latent clock cycle across the first bi-directional bus, DQ 116.

Therefore, in the thirteenth clock cycle, a fourth write command may be provided along bus 120 to the first register 122 and a fourth write information (W4) may be provided to the second register 128 along the bi-directional bus DQ 116. Furthermore, similar to clock cycles 2-4, clock cycles 14-16 provide for more write commands and more write information to be provided to the memory device and the storage array.

As illustrated in FIG. 3, due to latency requirements along a bi-directional bus, no information is transferred across the bi-directional bus DQ 116 during clock cycles 4-8, and 12. As recognized by one skilled in the art, the bi-directional bus DQ 116, must maintain a single clock cycle latency period, therefore clock cycle 12 and either 4 or 8 must remain inactive. Furthermore, the storage array does not receive any commands, either read or write commands, during clock cycles 4 and 8-12. As buses 120 and 126 are not bi-directional buses, there are no latency requirements. As such, during multiple clock cycles, the memory 102 cannot receive new commands nor can it write data to the storage array 114 or read data from the storage array 114, thereby creating inefficient information transfer.

One solution to overcome this limitation is the application of a plurality of memory devices having a plurality of bi-directional buses with a single memory controller. Thereupon, during the latency period of a first memory device, a second or third bi-directional bus coupled to the second or third memory device is activated. This system requires multiple memories coupled to a single memory controller and a module for controlling the timing of the multiple memories and the multiple bi-directional buses.

Consequently, there exists a need for an improved apparatus and method for data transfer between a memory controller and a single memory across a bi-directional bus.

BRIEF DESCRIPTION OF THE DRAWINGS

The invention will be more readily understood with reference to the following drawings, wherein:

FIG. 1 in an illustration of a prior art apparatus for data transfer;

FIG. 2 is an illustration of a prior art memory device within the apparatus of FIG. 1;

FIG. 3 illustrates a timing table representing the timing requirements for the prior art memory device of FIG. 2;

FIGS. 7.1 and 7.2 illustrate the steps taken in the method for data transfer, in accordance with one embodiment of the present invention;

DETAILED DESCRIPTION OF THE PREFERRED EMBODIMENT

The disclosed invention is a method and apparatus for a data transfer having a first bi-directional bus and a second bi-directional bus. The apparatus and method further includes a first register coupled to the first bi-directional bus and the second bi-directional bus and a second register also coupled to the first bi-directional bus and the second bi-directional bus. A first data packet is written to the first register via the first bi-directional bus and a second data packet written to the second register via the second bi-directional bus.

A memory controller is coupled to the first bi-directional bus, wherein the first data packet is provided from the memory controller to the first register via the first bi-directional bus. A storage array is coupled to the second bi-directional bus, wherein the second data packet is provided from the storage array to the second register via the second bi-directional bus.

The first data packet is provided to the storage array across the second bi-directional bus and the second data packet provided to the memory controller across the first bi-directional bus. Moreover, the first register, second register, second bi-directional bus and storage array are disposed within a memory, such as a ROM, RAM, DRAM, flash memory, etc., coupled to the memory controller via the first bi-directional bus, wherein the first bi-directional bus may be disposed within the memory.

A third register is operably coupled to the first register via the second bi-directional bus and the third register is operably coupled to the storage array, wherein the first data packet may be written to the third register while the second data packet is being provided from the storage array to the second bi-directional bus. A fourth register is operably coupled to the second bi-directional bus and the storage array, wherein the second data packet may be written to the fourth register if the second bi-directional bus contains the first data packet.

Whereupon, the present invention allows for efficient data transfer across a bi-directional bus incorporating the required latency period. A combination of registers and bi-directional buses allows for the smooth and efficient data transfer between a single memory controller and a single memory, such as a DRAM.

Figures 4, 6:
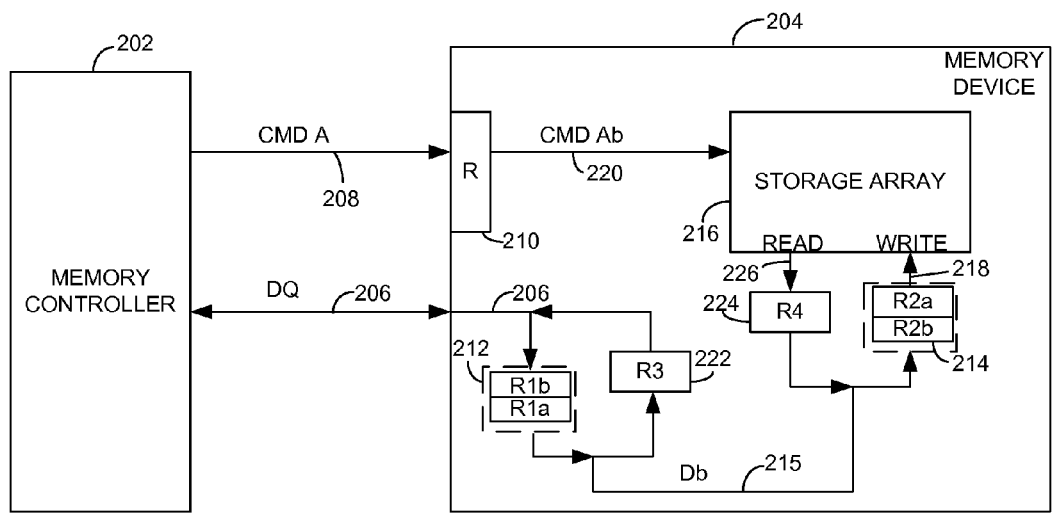
FIG. 4 illustrates a data transfer apparatus, in accordance with one embodiment of the present invention.
FIG. 6 illustrates a timing diagram representing the data transfer of the apparatus of FIG. 4.

FIG. 4 illustrates a data transfer system, in accordance with an embodiment of the present invention. The system consists of a memory controller 202 operably coupled to a memory device 204, such as a DRAM, via a first bi-directional bus 206 DQ. The memory controller 202 further provides a command line 208 to a register 210 disposed within the memory device 204, wherein the command from the memory controller 202, CMD A, is typically a read command or a write command. The first bi-directional bus 206 is operably coupled to a first register 212 within the memory device 204. The first register 212 is further coupled to a second register 214 via a second bi-directional bus 215 Db. As illustrated in FIG. 4, the first register 212 is composed of two registers, R1a and R1b, which is for illustrative purposes only and actual size of register 212 may be adjusted accordingly.

The second register 214 is coupled to a storage array 216. Furthermore, the command register 210 is coupled to the storage array 216 via bus 220 to provide a command, CMD Ab. Typically, if CMD Ab is a write command, the storage array 216 executes the command and receives the information to be written therein from the second register 214 via connection 218.

The memory device 204 further contains a third register 222 and a fourth register 224 for processing a read command. When CMD Ab is a read command, the storage array 216 provides information to be read therefrom to the fourth buffer 224 via connection 226. The read information is then provided to the third register 222 across the second bi-directional bus Db 215 and further provided to the memory controller 202 across the first bi-directional bus DQ 206. In accordance with the terms of the present invention, the first bi-directional bus DQ 206 includes but is not limited to the bus extending from the memory device 204 to the memory controller 202, but also includes the internal connection within the memory device 204 between the first register 212 and the third register 222 to the outside of the chip as noted in FIG. 4.

Components within the memory controller 202, such as a clock or at least one memory register have not been displayed for clarity purposes only. As recognized, the memory controller may contain a clock that performs clock timing cycles to coordinate the data transfer between the memory device 204 and the memory controller 202.

Figure 5:
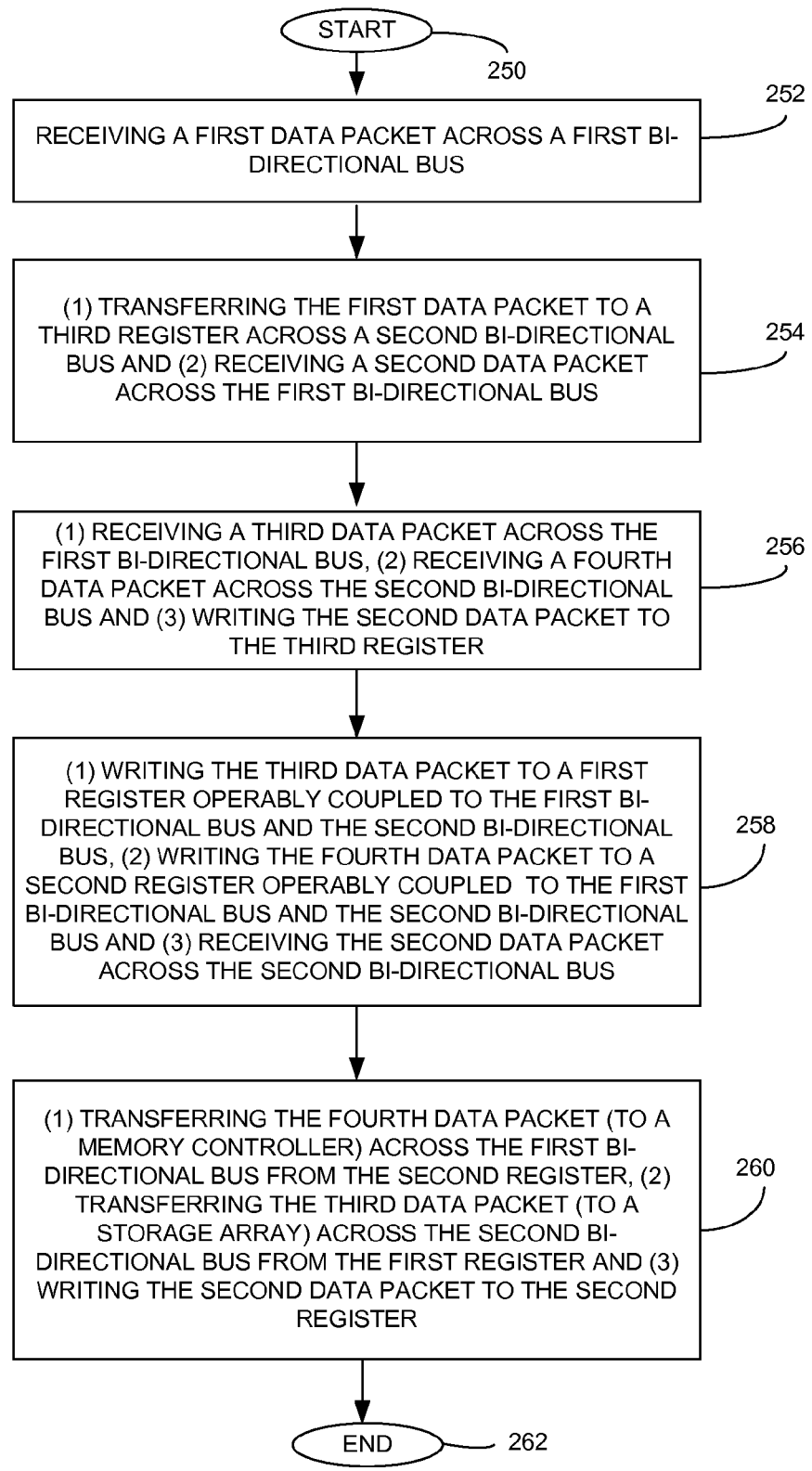
FIG. 5 illustrates the steps taken in the method for data transfer, in accordance with one embodiment of the present invention.

The method of data transfer, in accordance with one embodiment of the present invention, is illustrated in the flow chart of FIG. 5, as described with reference to FIG. 4. The process begins, 250, when a first data packet is received across the first bi-directional bus, DQ 206, designated at step 252. In the next step, 254, the first data packet is transferred to a third register, herein designated as the second register 214, and a second data packet is received across the first bi-directional bus DQ 206. It is noted that in one embodiment, the events occurring within a step of the flowchart of FIG. 5 occur simultaneously at a common clock cycle.

In the next step, 256, a third data packet is received across the first bi-directional bus DQ 206 and a fourth data packet is received across the second bi-directional bus Db 215, and the second data packet, which had been received across the first bi-directional bus in step 254 is written to the third register 214, the second register of FIG. 4. Next, in step 258, three separate events occur within the same clock cycle. The third data packet is written to a first register, 212, which is operably coupled the first bi-directional bus DQ 206 and the second bi-directional bus Db 215. Also, the fourth data packet is written to the second register 222, the third register 222 of FIG. 4, wherein the second register 222 is operably coupled to the first bi-directional bus DQ 206 and the second bi-directional bus Db 215. Moreover, the second data packet is received across the second bi-directional bus Db 215.

In the next step, 260, once again three separate events occur, first the fourth data packet is transferred to the memory controller 202 across the first bi-directional bus DQ 206 from the second register 222, the third data packet is transferred to a storage array 216 across the second bi-directional bus Db 215 from the first register 212 and further writing the second data packet to the second register, referred to previously as the third register 222 of FIG. 4. Thereupon, step 262 the processing system transfers data across a first bi-directional bus DQ 206 utilizing the latency period within step 258, but successfully transferring data in steps 256 and 260.

More specifically, the timing diagram of FIG. 6, in conjunction with the steps of FIGS. 7.1 and 7.2 illustrate with a greater level of detail the manner in which the present invention overcomes any latency concerns. For clarification purposes, each specific step designated in FIGS. 7.1 and 7.2 correspond to each of the clock cycles listed in the first row of the table 270 of FIG. 6. As recognized by one skilled in the art, FIG. 6 illustrates a table 270 representing timing diagrams, but this may be also accurately represented through specific timing diagrams rather than a table format.

Providing clarification of the table 270 of FIG. 6, the first column of elements corresponds to elements within the memory device 204. Element A represents the command A 208. Element Ab represents CMD Ab 220, SA represents the storage array 220, R4 represents the fourth register 224, R2a and R2b represent a plurality of registers disposed within the second register 214, element Db represents the second bi-directional bus 215, element R3 represents the third register 222 coupled to second bi-directional bus Db 215. R1a and R1b represent the plurality of registers within the first register 212, and element DQ represents the first bi-directional bus DQ 206 not only as disposed within the memory device 204, but also including the connection from the memory controller 202 to the memory device 204.

Referring now to FIG. 7.1, the process begins 280 when in the first step a first write command, CMD A, is received from the memory controller 202 and a first write data packet, W1, is received from the memory controller 202 across the first bi-directional bus DQ 206 designated as step 282. As referenced in FIG. 6, the first column illustrates that a write command is present as CMD A 208 and the first bi-directional bus currently contains the first write data packet.

In the next clock cycle, designated in FIG. 6 as the second clock cycle, a second write command is received from the memory controller 202. Also, the first write command is transferred to the storage array via bus 220 as CMD Ab, the first write data packet is transferred across the second bi-directional bus Db 215 passing the first register 212 and receiving a second write data packet from the memory controller 202 across the first bi-directional bus DQ 206. As illustrated in FIG. 6, a write command present as CMD A and as CMD Ab. Furthermore, the first write data packet is present across the second bi-directional bus Db 215 and further transferred to the first register, illustrated as passing through since no storage is required. The second write data packet (W2) is present across the first bi-directional bus 206.

In a third clock cycle, designated as step 286, a third write command is received from the memory controller 202 as CMD A. The second write command is transferred to the storage array 216, designated as CMD Ab 220. The first write data packet (w1) is written to the storage array 216 through the second register 214, via connection 218. The second write data packet (W2) is transferred across the second bi-directional bus Db 215 through the first register 212. Also, a third write data packet (W3) from the memory bus controller is received across the first bi-directional bus DQ 206. As illustrated in FIG. 6, the system contains three write commands, one as CMD A, one as CMD, and one as the command currently being executed by the storage array 216. The system also contains three write data packets, the first write data packet passing through the second register 214, the second write data packet passing through the first register 212 and also present on the second bi-directional bus 216, and finally the third write data packet present on the first bi-directional bus 206.

In the next step, 288, corresponding to the fourth clock cycle of FIG. 6, a first read command is received from the memory controller, the third write command is transferred to the storage array 216 as CMD Ab and the second write data packet (W2) is written to the storage array 216 through the second register 214 as the storage array 215 executes the second write command. The third write data packet (W3) is transferred across the second bi-directional bus Db 215 through the first register 212 and the fourth write data packet (W4) is received from the memory controller 202 across the first bi-directional bus 206. As illustrated with reference to FIG. 6, the table shows two write commands, one as CMD Ab and the second as a command within the storage array 216 and the system contains three write data packets with the second write data (W2) packet passing through the second register 214, the third write data packet (W3) passing through the first register array 212 and being transferred across the second bi-directional bus 216 and the fourth write data packet (W4) being transferred across the first bi-directional bus DQ 206.

In the next step, designated at 290, corresponding to clock cycle 5 of FIG. 6, a second read command is received from the memory controller 202, as CMD A. The first read command provided as command Ab 220 to the storage array 16. Further within the fifth clock cycle, the third write data packet (W3) is written to the storage array 216 through the second register 214. The fourth write data packet is transferred across the second bi-directional bus Db 215 through the first register 212 and a fifth write data packet (W5) is received from the memory controller 202 across the first bi-directional bus DQ 206. With reference to FIG. 6, the read command is illustrated as CMD A, the final write command is illustrated within the storage array 216 and the system currently contains three write data packets wherein the third write data packet (W3) is written to the storage array through the second register 214, the fourth write data packet (W4) is present on the second bi-directional bus Db 215, passing through the first register 212 and the fifth data packet (W5) is present on the first bi-directional bus DQ 206.

In the next step, 292, corresponding to clock cycle no. 6 of FIG. 6, a third read command is received from the memory controller 202 as CMD A 208. The second read command is transferred to the storage array 216 via path 220 as command Ab. The storage array 216 receives the first read command. The fourth write data packet (W4) is written to the second register 214, as the storage array 216 in this clock cycle does not execute any commands. The fifth write data packet (W5) is transferred across the second bi-directional bus Db 215 through the first register 212 and a sixth write data packet (W6) is received from the memory controller 202 across a first bi-directional bus DQ 206. With reference to FIG. 6, the memory device 204 contains two read commands, one as CMD A and one as command Ab. The device 204 further contains three write data packets, the fourth write data packet (w4) being stored within the second register 214, the fifth write data packet (W5) present along the second bi-directional bus Db 215, the fifth data packet passing through the first register array 212, and the sixth data packet being present across the first bi-directional bus DQ 206. As illustrated in FIG. 6, the memory device 204 now has three read commands, one as CMD A, one as CMD Ab and one as a command within the storage array 216.

The method then proceeds to step 294 designated as A transferred over to element A 294, FIG. 7.2 thereupon continuing to step 296 of FIG. 7.2. Step 298 corresponds to the seventh clock cycle as illustrated in FIG. 6. The third read command is transferred from the storage array 216 as CMD Ab and a first read data packet (Rd1) is transferred from the storage array 216 to the second bi-directional bus Db 215 in response to the first read command, passing through the buffer R4 224. The fifth write data packet (W5) is written to the second register 214, wherein the second register now contains the fourth write data packet and the fifth write data packet (W5) as the storage array 216 still has not received or executed a write command for the write data packets. The sixth write data packet (W6) is written to the first register 204 and a seventh write data packet (W7) is received from the memory controller 202 across the first bi-directional bus DQ 206. The memory device further contains four write data packets, the fourth write data packet (W4) and the fifth write packet (W5) are within to the second register array 214, the sixth write data packet (W6) being written to the first register array 212 and the seventh write data packet (W7) being present along the first bi-directional bus DQ 206.

The next step 300 occurs with respect to the eight clock cycle of FIG. 6. A fifth write command is received from the memory controller 202 as CMD A. A second read data packet (Rd2) is transferred from the storage array 216 to the second bi-directional bus Db 215 and the first read data packet (Rd1) is written to the third register 222. The seventh write data packet (W7), which was received across the first bi-directional bus DQ 206 from the previous clock cycle, is written to the first register 212. Corresponding to FIG. 6, CMD A is a write command and the system maintains two read commands, command Ab and the executing command of the storage array 216. The second read data packet (Rd2) is transferred onto the second bi-directional bus Db 215. After being passed through the fourth register 224. The second register array 214 still maintains two of the four write data packets, the fourth write data packet (W4) and the fifth write data packet (W5) and the first register array 212 contains the other two write data packets, the sixth write data packet (W6) and the seventh write data packet (W7). Furthermore, the third register 222 contains the second read data packet (Rd1), which was transferred across the second bi-directional bus Db 215. In this clock cycle, bi-directional bus DQ 206 does not contain any information, thus providing a one clock cycle latency between when a write data packet is provided to the memory device 204 and when a read data packet is then provided to the memory controller 202.

The next step of FIG. 7.2, 302, corresponds to the ninth clock cycle wherein a fifth write command is received from the memory controller 202. The fourth write command is transferred to the storage array 216, designated as command Ab. A third read data packet (Rd3), corresponding to the third read command executed by the storage array 216 is transferred from the storage array 216 to the second bi-directional bus Db 215, passing through the fourth register 224. The second read data packet (Rd2) is written to the third register 222 and the first read data packet (Rd1) is transferred to the memory controller 202 across the first bi-directional bus DQ 206. With reference to FIG. 6, CMD A and CMD Ab are both write commands. The storage array executes a read command and provides a third read data packet (Rd3) to the second bi-directional bus Db 215 passing through the fourth register, R4. The second register 214 still contains the fourth write data packet (W4) and the fifth write data packet (W5), while the storage array 216 is still executing read commands. During this clock cycle, the second read data packet (Rd2) is stored within the third register while the first read data packet (Rd1) was being transferred across the first bi-directional bus 206. As with clock cycle 8, the first register 212 still contains the sixth write data packet (W6) and the seventh write data packet (W7).

The next step 304 corresponds to clock cycle 10 of FIG. 6. A sixth write command is received from the memory controller 202, designated as command A. The fifth write command is transferred to the storage array from the command register 210, designated as command Ab. Thereupon the storage array 216 executes a write command and the fourth write data packet (W4) is written to the storage array from the second register 214. The third read data packet (Rd3) is written to the third register, 222 wherein the second read data packet (Rd2) is transferred across the first bi-directional bus DQ 206 to the memory controller 202. With reference to FIG. 6, the system has three write commands, CMD A, CMD Ab and the command executed by the storage array 216. The fourth register is currently empty, as the storage array 216 has not executed a read command. The second register 214 now holds only the fifth write data packet (W5), whereas the sixth write data packet (W6) is being transferred across the second bi-directional bus Db 215 and the first register 212 only contains the seventh write data packet (W7). The third register 222 holds the third read data packet (Rd3) and the second read data packet (Rd2) is transferred across the first bi-directional bus 206.

The next step of the method is illustrated with step 306 corresponding to clock cycle 11 of FIG. 6. During this clock cycle a seventh write command is received from the memory controller, as command A. The sixth write command is transferred from the register 210 to the storage array 216 as command Ab. The fifth write data packet (W5) is written to the storage array 216 from the second register 214 in response to the storage array executing the fifth write command. The sixth write data packet (W6) is written to the second register 214 and the seventh write data packet (W7) is provided to the second register across the second bi-directional bus Db 215. Thereupon, the first register 212 does not currently store any data. Moreover, the third read data packet (Rd3) is transferred to the memory controller 202 across the first bi-directional bus DQ 206. With reference to FIG. 6, this clock cycle fully resembles the first clock cycle with the exception of the first bi-directional bus now transferring a read data packet to the memory controller 202 instead of a write data packet from the memory controller 202 to the memory device 204.

Upon the completion of the eleventh clock cycle, the method of data transfer providing for efficient data transfer, overcoming bi-directional bus latency requirements has been completed, designated at step 308. The system overcomes these limitations by storing write data information within designated registers across a second bi-directional bus 216 to compensate for times when the read command must be executed. For further reference, FIG. 6 illustrates another four clock cycles, in that the twelfth clock cycle another write command is provided as command A. The seventh write command, which was disposed within the register 210, is provided to the storage array 216 as command Ab and the storage array 216 executes the sixth write command, writing the sixth write data packet (W6) from the second register 214 therein. Furthermore, the seventh write data packet (W7), which was along the second bi-directional bus Db 215 in the previous clock cycle, is now disposed within the second register 214. Furthermore, during this clock cycle the first bi-directional bus DQ 206 is once again inactive. Therefore, during the following clock cycle, clock cycle 13, write data may be transferred from the memory controller 202 to the memory device 204.

During the thirteenth clock cycle, a write command is provided as command A to the memory device 204, the previous write command is provide as command Ab to the storage array 216 and the storage array 216 executes the previous write command to write the seventh write data packet (W7) to the storage array 216. Furthermore, as the bi-directional bus DQ06 was being used to read data to the memory controller 202, no new write data has been able to be presented to the memory device 204, therefore during this clock cycle the eighth write data packet (W8) is provided across the first bi-directional bus DQ 206.

In clock cycle 14, a write command is provided from the memory controller, as CMD A and the previous write command provided as CMD A is now CMD Ab. Due to latency, in the previous clock cycle there was no command Ab, therefore the storage array 216 is inactive for this current clock cycle. Within the fourteenth clock cycle, the data is provided further to the internal register and provided across the bi-directional buses to be provided to the storage array 216, therefore the eighth write data packet (W8) is transferred across the second bi-directional bus Db 215 through the first register array 212 and a ninth write data packet (W9) is provided from the memory controller 202 across the first bi-directional bus DQ 206. In the fifteenth clock cycle, no new write command is provided from the memory controller, therefore CMD Ab is the previous CMD A and the storage array executes the previous clock cycle's command Ab. Executing the command, the eighth write data packet (W8) is written to the storage array 216 through the second register array 214, the ninth write data packet (W9) is provided along the second bi-directional bus Db 215 and a tenth write data packet (W10) is provided to the memory device 204 from the memory controller 202 across the first bi-directional bus DQ 206.

FIG. 6 illustrates 15 clock cycles to represent one full execution cycle of a plurality of read commands and write commands, showing how the array of registers dispose between a plurality of bi-directional buses allows for a single bi-directional bus having a latency requirement to operate more efficiently. The memory device 204 to efficiently transfers read information and write information to and from the memory controller 202 without losing system efficiency due to the one clock cycle latency requirement of the first directional bus DQ 206. Furthermore, the register arrays in combination with the bi-directional buses allow for a single memory device to efficiently interact with a single memory controller, thereby eliminating the need to have multiple memory devices to overcome any latency problems.

Figure 8:
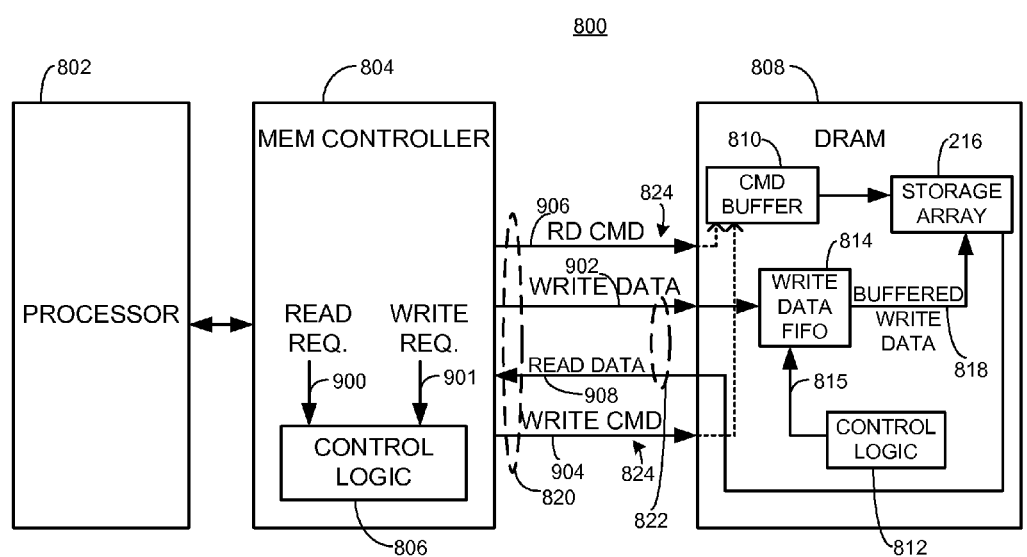
FIG. 8 is a block diagram illustrating one example of a DRAM in accordance with one embodiment of the invention.

FIG. 8 illustrates another embodiment, where there is no need for two or more bi-directional buses or links. In this example, only a single bi-directional bus or link is needed. As shown, a system 800 may include a processor 802 such as a CPU, co-processor, graphics processor or any other suitable processor or logic and a memory controller 804 that may be, for example, embedded in the processor 802 or a separate integrated circuit or other circuit as desired. The memory controller 804 operates generally as previously described however in this example, it includes control logic 806 that operates as described below based on receiving read requests 900 and write requests 901 (which requests may include, for example, commands and associated data, as for example, commanded by processor 802). The dynamic random access memory 808 in addition to the storage array 216 which may include, for example, command buffers 810 (as shown herein as outside the storage array, however it will be recognized that command buffers may be included in any suitable circuit as known in the art) also includes control logic 812 operatively coupled to write data buffer 814, which buffers write data to be sent to the storage array 216. The write data buffer 814 may be any suitable memory element such as a FIFO buffer, register or other memory element. The control logic 812 controls the write data buffer 814 via control information 815 to buffer write data associated with a yet to be received corresponding write command and to output the buffered write data 818, to the storage array 216 in response to a later received corresponding write command as further described below. As shown, a bi-directional bus 820, as such as the type described above, may include, for example, a data bus 822 and a command bus 824 if desired. However, it will be recognized that any suitable link may be used including a wireless link and any other suitable configuration to facilitate the communication of commands and data.

Figure 9:
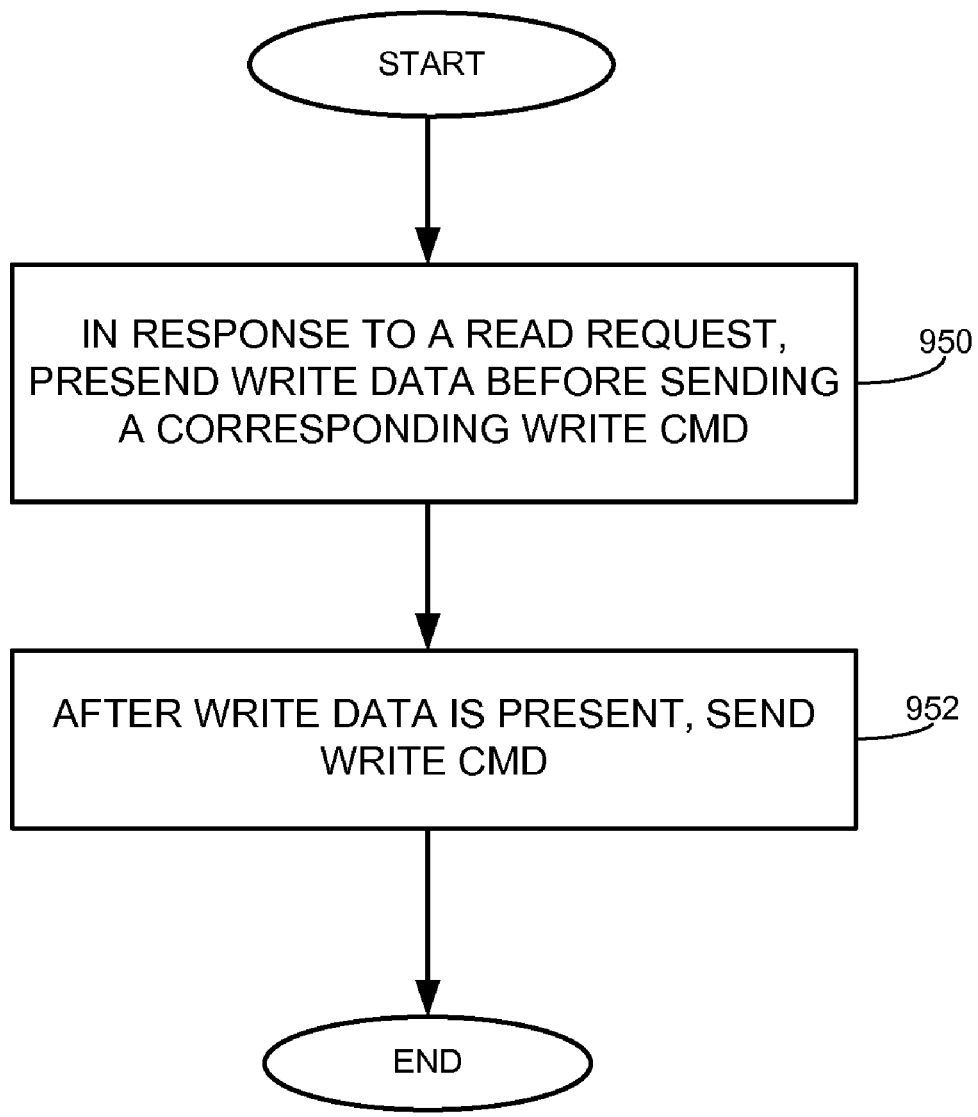
FIG. 9 is a flowchart illustrating one example of a method for communicating information over a bi-directional bus in accordance with one embodiment of the invention.

FIG. 9 illustrates one example of a method for data transfer that may be employed, for example, by the system 800 shown in FIG. 8 or any other suitable structure. In this example, the method may be carried out by memory controller 804 wherein in response to a read request 900 from processor 802, the memory controller presends write data 902 before sending a corresponding write command 904, as shown in block 950. For example, in order to expedite the processing of communication of data transfer, during a read request, such as when a read command 906 is sent to the DRAM 808, write data 902 is sent by the memory controller 804 without the write command, via a data bus during a read cycle, such as when the memory controller 804 is waiting for requested read data. The pre-sent write data is then buffered by the write data buffer 814. As shown in block 952, the method includes, after write data 902 is pre-sent (sent prior to a corresponding write command 824) sending the write command 824 via the command bus. As such, write data may be sent during the waiting for read data to be sent back over a data bus. As such, the data bus is used in a more efficient manner and is not idle as write data can be sent during a read command operation. Since the command bus 824 is used to carry out a read operation, the write command 904 is not sent until, for example, read data 908 has been received back from the memory controller in response to the read command 906.

Figure 10:
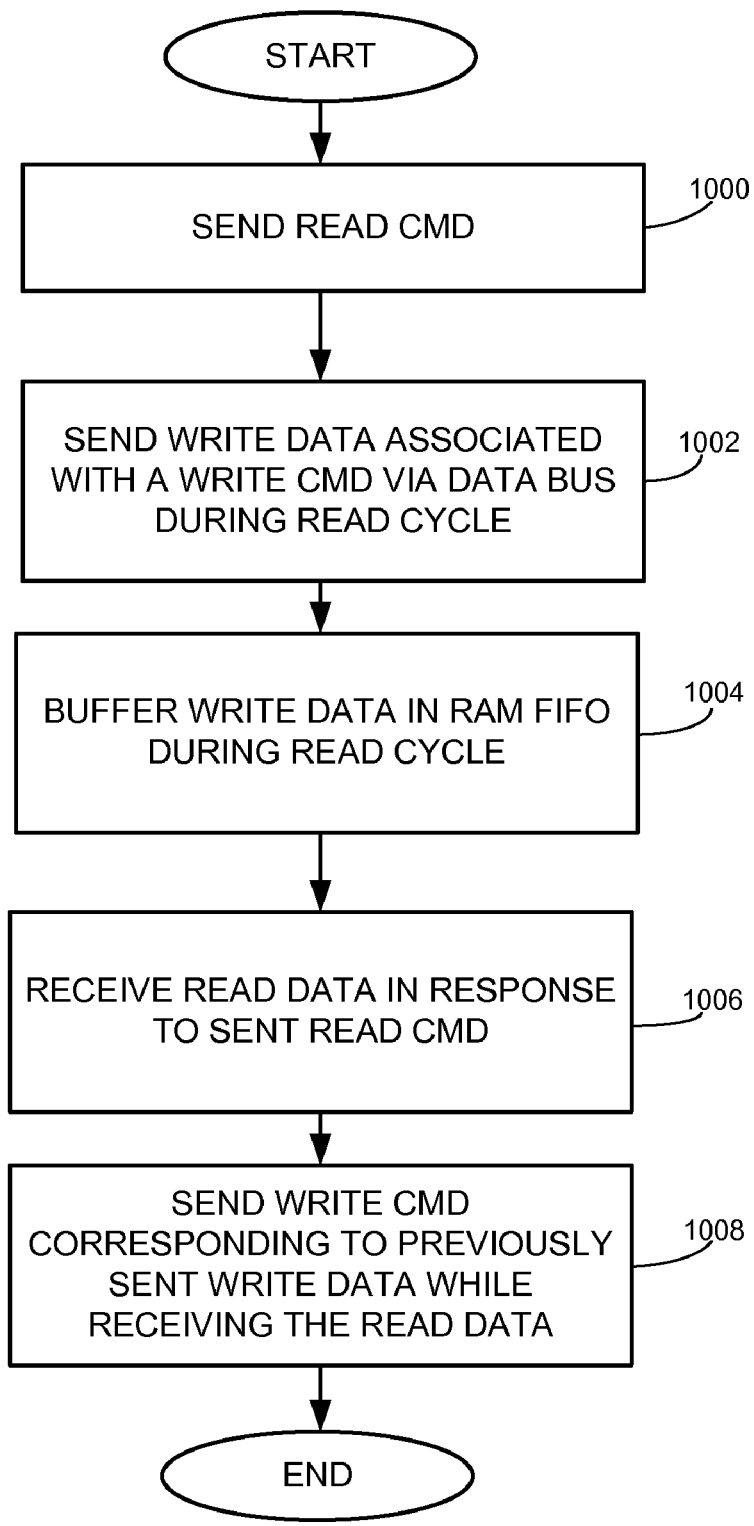
FIG. 10 is a flowchart illustrating one example of a method for communicating information over a bi-directional bus in accordance with one embodiment of the invention.

For example, referring to the method shown in FIG. 10, a method for data transfer may include, for example, the memory controller, or any other suitable element, sending a read command 906, as shown in block 1000, to the DRAM 808 via command bus 824. The method includes, as shown in block 1002, sending write data 902 associated with a write command that has not yet been sent, via the data bus 822, for example during a read cycle or while the memory controller or DRAM is in a mode to set up to do a read request. As shown in block 1004, the method includes, for example, the DRAM 808 buffering the write data 902 in a memory element 814 during the read cycle.

As shown in block 1006, the method includes the memory controller 804 or any other device, receiving the read data 908 in response to the sent read command 906. As shown in block 1008, the method includes sending the write command 904, corresponding to the previously sent write data 902, while receiving the read data 908 on the data bus 822.

From DRAM's 808 perspective, the method for data transfer includes, for example, receiving the read command 906 via the command bus 824, receiving the buffering write data 818 associated with a write command that is yet to be sent, via the data bus 824. This may be done, for example, during a read cycle such as while waiting during the sending of read data. The method includes sending the read data 908 in response to the receiving read command 906. The DRAM then receives the write command 904 in this example during the read data 908 being sent and the write command 904 corresponds to the previously received and buffered write data 902. The DRAM then transfers the buffered write data 818 to the storage array 216 in response to the write command 904 being processed.

As such, among other advantages, a write data memory element 814 is utilized to store write data before a write command associated with the write data has been received by the DRAM. The write data may be sent, or received, in response to a read command on a command bus and during a waiting time for the requested read data to be sent so that the data bus is not unnecessarily idle. The write command may then be sent on the command bus after the write data itself has been sent to the DRAM. Other advantages will be recognized by those of ordinary skill in the art.

It should be understood that the implementation of other variations and modifications of the invention in its various aspects as may be readily apparent to those of ordinary skill in the art, and that the invention is not limited by the specific embodiments described herein. For example, the register arrays 212, 214, 222 and 224 of FIG. 4 may contain a plurality of registers for holding a larger quantity of data between data transfers. It is therefore contemplated to cover by the present invention any and all modifications, variations or equivalents that fall within the spirit and scope of the basic underlying principles disclosed and claimed herein.

What is claimed is:

1. A memory device comprising:
a storage array;
an incoming write data buffer operatively coupled to the storage array;
control logic, operatively coupled to the write data buffer, and operative to control the write data buffer to buffer write data associated with a yet to be received corresponding write command and to output the buffered write data to the storage array in response to a later received corresponding write command;
a bi-directional bus operatively coupled to the incoming write data buffer and the storage array and wherein the control logic is operative to control sending of requested read data over the bi-directional bus in response to a read command while receiving the corresponding write command.

2. A memory device comprising:
a write register;
a read register;
a storage array operatively coupled to the write and read registers; and
control logic operative to, during a first clock cycle, write incoming data to the write register and provide read data from the storage array to the read register and during a second clock cycle, transfer the data from the read register out of the memory device on a bi-directional bus and moving the write data from the write register to the storage array through another bi-directional bus.

3. An apparatus for data transfer comprising:
a memory controller; and
a memory device comprising:
(a) receiving a first data packet across a first bi-directional bus;

(b) receiving a second data packet across a second bi-directional bus;
(c) writing the first data packet to a first register operably coupled to the first bi-directional bus and the second bi-directional bus;
(d) writing the second data packet to a second register operably coupled to the first bi-directional bus and the second bi-directional bus;
(e) transferring the second data packet across the first bi-directional bus;
(f) transferring the first data packet across the second bi-directional bus;
wherein the memory controller is operatively coupled to the memory device through the second bi-directional bus.

4. A method for data transfer comprising:
writing a first received data packet to a first register operatively coupled to a first bi-directional bus and a second bi-directional bus;
writing a second data packet to a second register operatively coupled to the first bi-directional bus and the second bi-directional bus wherein writing the second data packet comprises writing the second data from a third register;
transferring the second data packet across the first bi-directional bus; and
transferring the first data packet across a second bi-directional bus to a fourth register.

* * * * *